(12) United States Patent
Han et al.

(10) Patent No.: US 6,172,516 B1
(45) Date of Patent: Jan. 9, 2001

(54) OUTPUT BUFFERING APPARATUS AND METHOD

(75) Inventors: Byung-hun Han, Goyang; Byung-kwon An, Kunpo, both of (KR)

(73) Assignee: Samsung Electronics Co., LTD (KR)

( * ) Notice: Under 35 U.S.C. 154(b), the term of this patent shall be extended for 0 days.

(21) Appl. No.: 09/351,075

(22) Filed: Jul. 9, 1999

(30) Foreign Application Priority Data

Jul. 20, 1998 (KR) .................................. 98-29135

(51) Int. Cl.$^7$ ....................... H03K 17/16; H03K 19/0175
(52) U.S. Cl. .................................. 326/27; 326/87
(58) Field of Search ................. 326/21, 26, 27, 326/82, 83, 85, 86, 87

(56) References Cited

U.S. PATENT DOCUMENTS

| | | | |
|---|---|---|---|
| 4,890,016 | * 12/1989 | Tanaka et al. | 326/27 |
| 4,967,110 | * 10/1990 | Matsuura | 326/21 |
| 5,036,222 | 7/1991 | Davis | 326/87 |
| 5,153,450 | 10/1992 | Ruetz | 326/87 |
| 5,194,764 | * 3/1993 | Yano et al. | 326/86 |
| 5,646,543 | * 7/1997 | Rainal | 326/26 |
| 6,034,548 | * 3/2000 | Churcher et al. | 326/27 |

* cited by examiner

Primary Examiner—Trong Phan
(74) Attorney, Agent, or Firm—Samuels, Gauthier & Stevens

(57) ABSTRACT

An output buffer capable of reducing the noise and distortion of buffered output data while operating at high speed, and a buffering method performed in the output buffer are provided. An output buffer for buffering input data and outputting buffered input data as output data comprises first through M-th and (M+1)th through (M+N)th delay means for delaying the input data for (M+N) different delay times and outputting one by one delayed data in a predetermined order at time intervals of

$$\frac{T}{M+N},$$

where M and N are each integers equal to or greater than 2, and T corresponds to the time necessary for the level of the output data to change, and a data output means for outputting the output data in response to the outputs of the first through (M+N)th delay means.

12 Claims, 5 Drawing Sheets

OUTPUT BUFFERING APPARATUS AND METHOD

BACKGROUND OF THE INVENTION

1. Field of the Invention

The present invention relates to an output buffer and an output buffering method, and more particularly, to an output buffer which can be used for an integrated circuit.

2. Description of the Related Art

Conventional output buffers have been disclosed in many texts. For example, a conventional output buffer is shown in FIGS. 5–61 on pages 229–230 in a text which was written by Neil Weste and Kamran Eshraghian and published with a title "Principles of CMOS VLSI design" and a subtitle—A systems perspective—in 1985 by the Addison Wesley publishing company.

Figure 1:
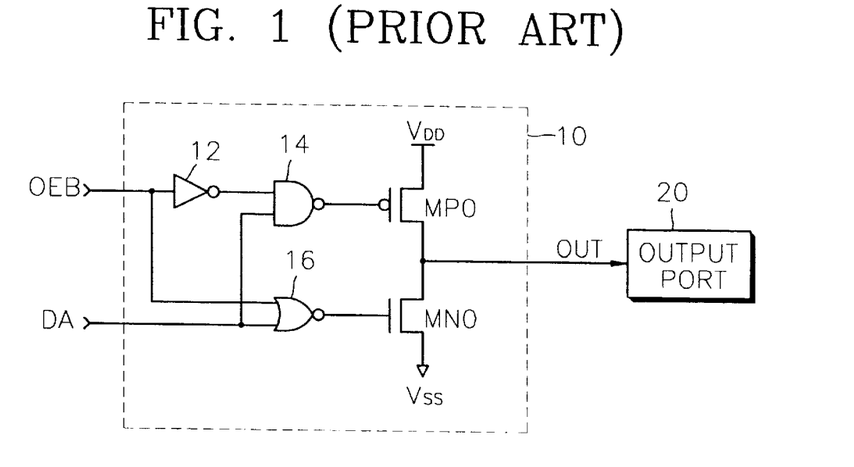
FIG. 1 is a block diagram illustrating a conventional output buffer.

FIG. 1 shows a conventional output buffer comprised of an output buffer 10 and an output port 20. The output buffer 10 is comprised of an inverter 12, a NAND gate 14, a NOR gate 16, and PMOS and NMOS transistors MP0 and MN0.

The output buffer 10 of FIG. 1, which is used for an integrated circuit, delays input data DA having a logic "high" or "low" level for a predetermined period of time and provides the delayed data to the output port 20. The output buffer 10 is built in the integrated circuit. Generally, the output buffer 10 is enabled in response to an output enable signal OEB having a logic "low" level. When the input data DA is a logic "high" level, the output buffer 10 applies a source current to a load capacitor (not shown) included in the output port 20 using a pull-up transistor MP0 and thus charges the load capacitor with the source current, thereby increasing the potential of the output port 20. When the input data DA is a logic "low" level, the output buffer 10 sinks the current charged into the load capacitor (not shown) of the output port 20 using a pull-down transistor MN0, thereby discharging the capacitor and lowering the voltage of the signal output from the output port 20.

In the circuit of FIG. 1, in order to sufficiently drive a load (not shown) connected to the output port 20, a relatively large amount of current must flow in the pull-up and pull-down transistors MP0 and MN0 of the output buffer 10, as compared to other circuits within a system that uses the output buffer 10. When such a current passes through the bonding wire and the lead frame of a power supply $V_{DD}$ and a ground $V_{SS}$ pin, an induced electromotive force [V(t)] expressed by the following Equation 1 is generated:

$$V(t) = L\left(\frac{di}{dt}\right), \quad (1)$$

wherein L denotes inductance and i denotes the current supplied to a load (not shown) connected to the output port 20. Here, the induced electromotive force causes the ground voltage (or a reference voltage) $V_{SS}$ to bounce. That is, the conventional output buffer 10 has a problem in that a ground bounce effect is caused by the induced electromotive force. Furthermore, as can be seen from Equation 1, ground bounce becomes more serious with an increase in the total amount of inductance or in the variation of current according to time.

Due to the development of semiconductor manufacturing techniques and increases in the operational speed of systems including semiconductors, the size of a load (not shown) to be driven by the single output buffer 10 increases, and the driving speed becomes faster. Hence, the noise and distortion in a buffered signal OUT are increased due to the ground bounce effect and an impedance mismatch between the output port 20 and the output buffer 10.

SUMMARY OF THE INVENTION

To solve the above problems, it is an object of the present invention to provide an output buffer capable of reducing noise and distortion of buffered output data while operating at high speed.

It is another object of the present invention to provide a data buffering method for buffering data in the above output buffer.

Accordingly, to achieve the first object, there is provided an output buffer for buffering input data and outputting buffered input data as output data. The output buffer includes first through M-th and (M+1)th through (M+N)th delay means for delaying the input data for (M+N) different delay times and outputting one by one delayed data in a predetermined order at time intervals of $$\frac{T}{M+N},$$

where M and N are each integers equal to or greater than 2, and T corresponds to the time necessary for the level of the output data to change. The buffer of the invention also includes a data output means for outputting the output data in response to the outputs of the first through (M+N)th delay means.

In accordance with another embodiment of the invention, there is provided an alternative output buffer for buffering input data and outputting buffered input data as output data. This alternative output buffer includes a data input means enabled in response to an output enable signal, to invert the input data and output the inverted input data. The buffer also includes first through fourth delay means for delaying the inverted input data for first, second, third and fourth predetermined times and outputting one by one delayed data in a predetermined order at time intervals of $$\frac{T}{4},$$

where T corresponds to the time necessary for the level of the output data to change. First and second pull-up transistors are separately turned on in response to the outputs of the first and second delay means. Each of the first and second pull-up transistors has a source and drain connected between a supply voltage and the output data. First and second pull-down transistors are separately turned on in response to the outputs of the third and fourth delay means. Each of the first and second pull-down transistors has a drain and source connected between the output data and a reference voltage.

In accordance with the invention, there is also provided a buffering method performed in an output buffer for buffering input data and outputting buffered input data as output data. According to the method of the invention, the input data for (M+N) are delayed for different predetermined times. First through (M+N)th delayed data are generated in a predetermined order at time intervals of $$\frac{T}{M+N},$$

where M and N are each integers equal to or greater than 2, and T corresponds to the time necessary for the level of the output data to change. It is determined whether the input data has changed from a first logic level to a second logic level, wherein the second logic level is complementary to the first logic level. The level of the output data is gradually changed from the first logic level to the second logic level at time intervals of $$\frac{T}{M+N}$$

in response to the first through (M+N)th delayed data which are generated in a predetermined order, if the level of the input data changes from the first logic level to the second logic level. The level of the output data is gradually changed from the second logic level to the first logic level at time intervals of $$\frac{T}{M+N}$$

in response to the (M+N)th through first delayed data which are generated in a predetermined order, if the level of the input data changes from the second logic level to the first logic level.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 2:
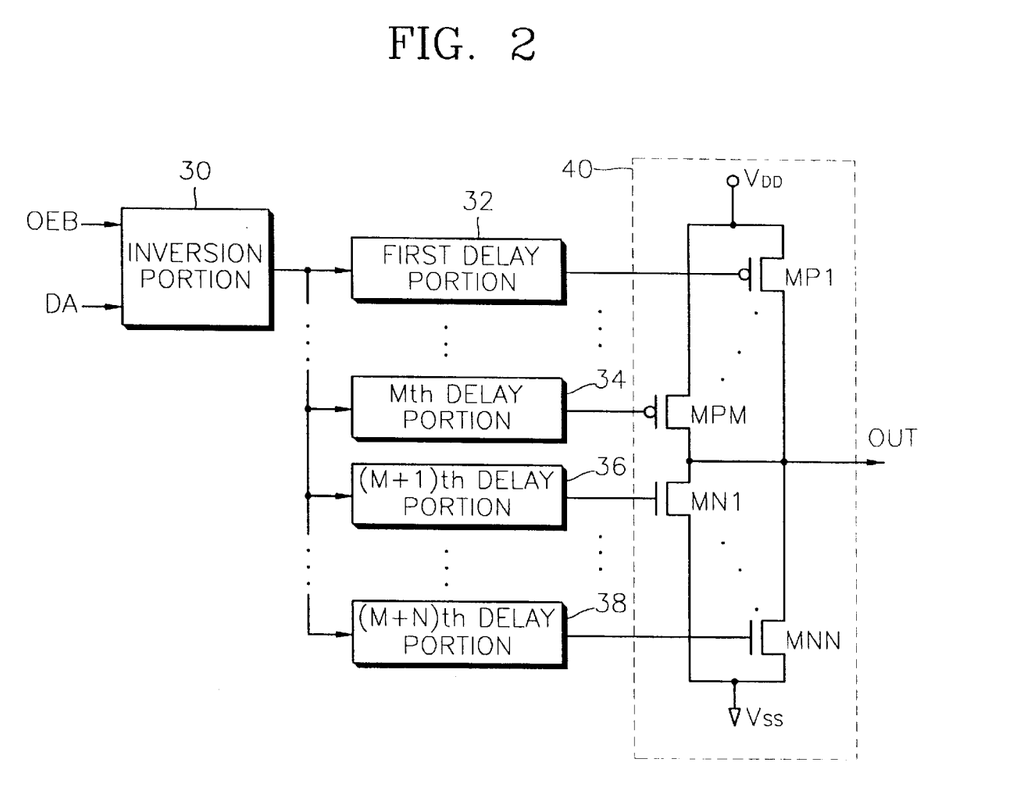
FIG. 2 is a schematical block diagram illustrating an output buffer according to one embodiment of the present invention.

Referring to FIG. 2, an output buffer according to one embodiment of the present invention is comprised of an inversion portion 30, first through M-th delay portions 32 through 34, (M+1)th through (M+N)th delay portions 36 through 38, and a data output portion 40 comprised of first through M-th pull-up transistors MP1 through MPM and first through N-th pull-down transistors MN1 through MNN.

The inversion portion 30 shown in FIG. 2 inverts input data DA and outputs inverted input data to first through M-th and (M+1)th through (M+N)th delay portions 32 through 34 and 36 through 38, respectively, (where M and N are positive integers each equal to or greater than 2). The inversion portion 30 is enabled in response to an output enable signal OEB and then inverts the input data DA. The first through M-th and (M+1)th through (M+N)th delay portions 32 through 34 and 36 through 38, respectively, delay the inverted input data for M+N different delay times, and output delayed data one by one to the data output portion 40 at time intervals of $$\frac{T}{M+N}$$

(where T denotes the time necessary for the level of output data output via an output terminal OUT to change). That is, each of the first through M-th and (M+1)th through (M+N)th delay portions 32 through 34 and 36 through 38 delays inverted input data for a different time, and outputs the delayed data to the data output portion 40 at time intervals of $$\frac{T}{M+N}.$$

Here, each of the first through M-th and (M+1)th through (M+N)th delay portions 32 through 34 and 36 through 38 can be comprised of two serially-connected inverters as described below. Each of these inverters is a complementary MOS (CMOS) transistor, and (M+N) different delay times are controlled by changing the aspect ratio of each of the CMOS transistors. That is, a CMOS transistor constituting an inverter includes PMOS and NMOS transistors. If the aspect ratio of the PMOS transistor is made different from that of the NMOS transistor, the length of time for which data is delayed in each delay portion depends on whether the PMOS transistor is turned on or the NMOS transistor is turned on. Accordingly, the sequence of operations of pull-up and pull-down transistors MP1 through MPM and MN1 through MNN depends on whether the input data DA is changed from a logic "high" level to a logic "low" level or from a logic "low" level to a logic "high" level.

The data output portion 40 outputs output data to an output port (not shown) via an output terminal OUT in response to the outputs of the first through (M+N)th delay portions 32 through 34 and 36 through 38. To achieve this, the data output portion 40 can be comprised of first through M-th pull-up transistors MP1 through MPM and first through N-th pull-down transistors MN1 through MNN. The first through M-th pull-up transistors MP1 through MPM are turned on in response to the outputs of the first through M-th delay portions 32 through 34, respectively, and each can be realized as a PMOS transistor, having a source and a drain connected between a power supply $V_{DD}$ and output terminal OUT. That is, the first pull-up transistor MP1 operates in response to data delayed in the first delay portion 32, and the M-th pull-up transistor MPM operates in response to data delayed in the M-th delay portion 34. Consequently, one of the first through M-th pull-up transistors MP1 through MPM corresponds to the pull-up transistor MP0 shown in FIG. 1. The other pull-up transistors shown in FIG. 2 play the role of providing a large amount of source current to an output port (not shown) within a short period of time.

The first through N-th pull-down transistors MN1 through MNN are turned on in response to the outputs of the (M+1)th through (M+N)th delay portions 36 through 38, respectively, and each can be realized as an NMOS transistor, having a drain and a source connected between the output data OUT and a reference voltage $V_{SS}$. That is, the first pull-down transistor MN1 operates in response to data delayed in the (M+1)th delay portion 36, and the N-th pull-down transistor MNN operates in response to data delayed in the (M+N)th delay portion 38. Consequently, one of the first through N-th pull-down transistors MN1 through MNN corresponds to the pull-down transistor MN0 shown in FIG. 1. The other pull-down transistors shown in FIG. 2 play the role of discharging a large amount of sink current provided from the output port (not shown) within a short period of time.

In the output buffer shown in FIG. 2, the inversion portion 30 may be omitted. That is, the first through (M+N)th delay portions 32 through 34 and 36 through 38 can directly receive the input data DA, delay the input data DA for different periods of time, and output delayed input data one by one to the data output portion 40. In this case, in contrast with what is shown in FIG. 2, pull-up transistors in the data output portion 40 are realized with NMOS transistors, and pull-down transistors therein are realized with PMOS transistors. However, the swing width of output data in this case is smaller than that of output data OUT output from the output buffer of FIG. 2, so that the level of the power supply $V_{DD}$ should be greater.

Hereinafter, it is assumed that M(=N) is equal to 2, in order to simplify description of the operation of the output buffer according to the present invention shown in FIG. 2.

Figure 3:
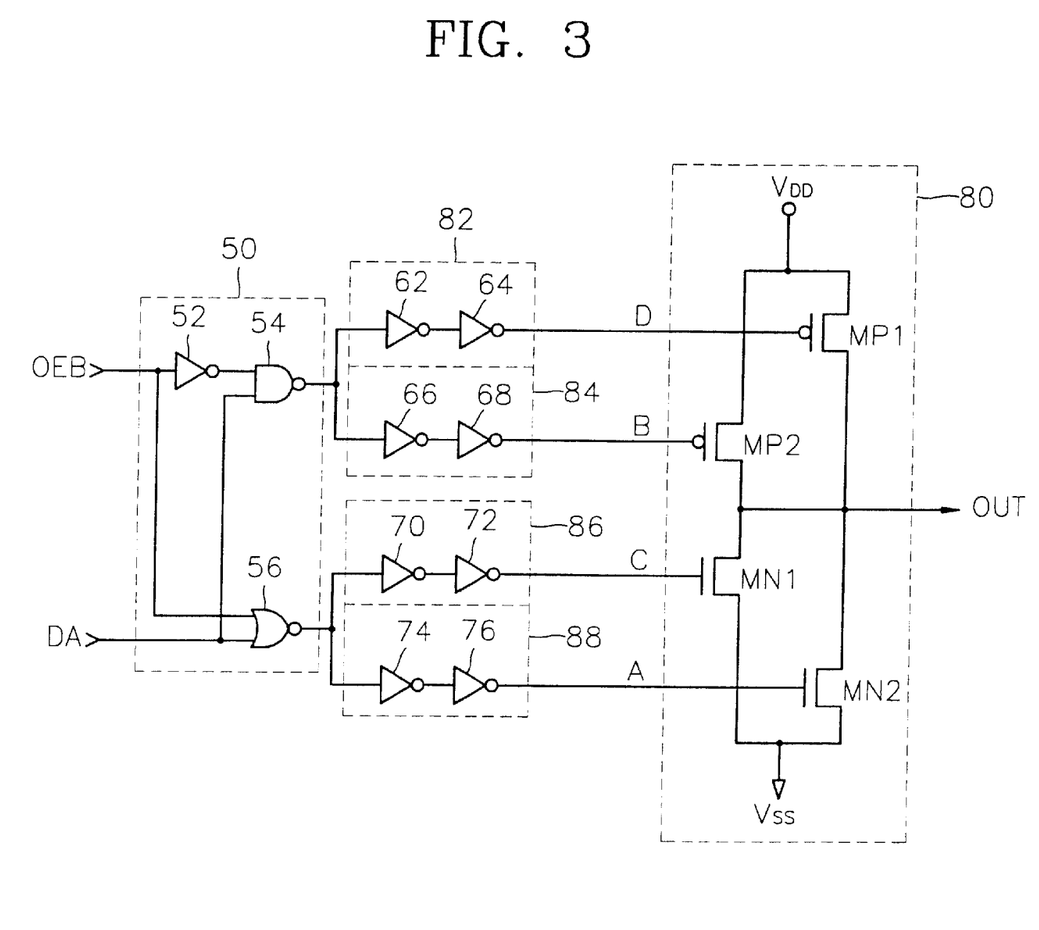
FIG. 3 is a circuit diagram illustrating the output buffer shown in FIG. 2 according to an embodiment of the present invention.

FIG. 3 is a circuit diagram illustrating the output buffer shown in FIG. 2 according to an embodiment of the present invention, when M=N=2. Referring to FIG. 3, the output buffer includes a data input portion 50, first, second, third and fourth delay portions 82, 84, 86 and 88, and a data output portion 80. The data input portion 50 includes an inverter 52, a NAND gate 54 and a NOR gate 56. The first delay portion 82 includes inverters 62 and 64, the second delay portion 84 includes inverters 66 and 68, the third delay portion 86 includes inverters 70 and 72, and the fourth delay portion 88 includes inverters 74 and 76. The data output portion 80 is comprised of first and second pull-up transistors MP1 and MP2 and first and second pull-down transistors MN1 and MN2.

Figure 4A:
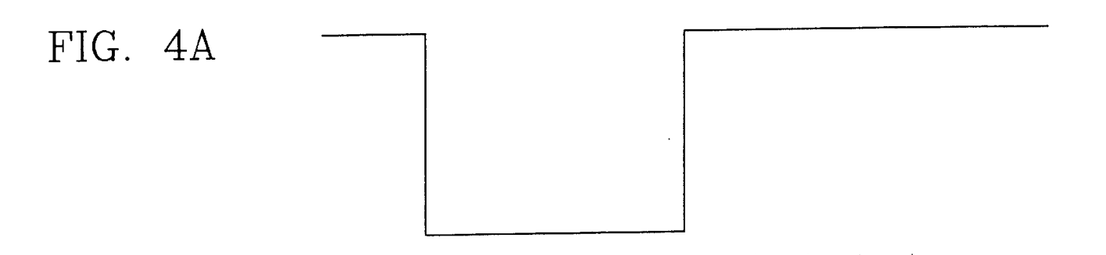
FIGS. 4A through 4F contain waveform diagrams of waveforms generated at certain portions of the circuit shown in FIG. 3.
Figure 4B:
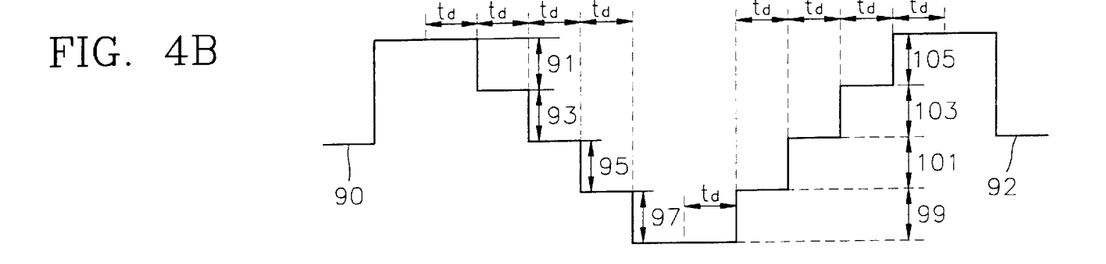
Figure 4C:
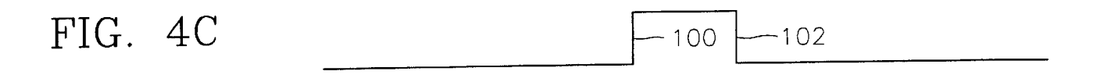
Figure 4D:
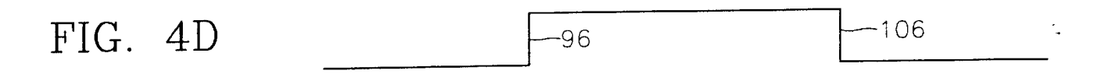
Figure 4E:
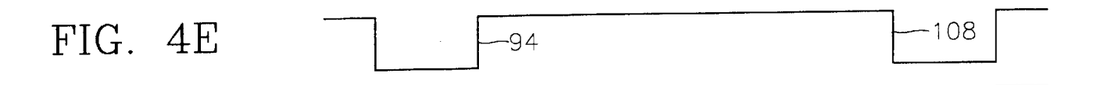
Figure 4F:
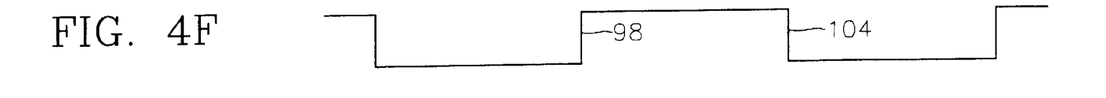

FIGS. 4A through 4F are views of waveforms of portions shown in FIG. 3. FIG. 4A shows the waveform of input data DA, FIG. 4B shows the waveform of output data output via an output terminal OUT, FIG. 4C shows the waveform of data A output from the fourth delay portion 88, FIG. 4D shows the waveform of data C output from the third delay portion 86, FIG. 4E shows the waveform of data D output from the first delay portion 82, FIG. 4F shows the waveform of data B output from the second delay portion 84.

The data input portion 50, the first through fourth delay portions 82, 84, 86 and 88, and the data output portion 80 shown in FIG. 3 perform the same functions as the inversion portion 30, the first through fourth delay portions, and the data output portion 40, respectively. However, since M and N are each assumed equal to 2 as described above, the output buffer of FIG. 3 adopts only four delay portions, two pull-up transistors, and two pull-down transistors.

When the data input portion 50 of FIG. 3 is enabled in response to an output enable signal OEB, it inverts the input data DA shown in FIG. 4A and outputs the inverted input data to the first, second, third and fourth delay portions 82, 84, 86 and 88. To achieve this, the data input portion 50 has the same structure as part of the structure of the output buffer of FIG. 1. That is, the inverter 52 of the data input portion 50 inverts the output enable signal OEB and outputs the inverted signal to the NAND gate 54. The NAND gate 54 performs an inverse AND operation on the output of the inverter 52 and the input data DA, and outputs the result of the inverse AND operation to the first and second delay portions 82 and 84. The NOR gate 56 performs an inverse OR operation on the input data DA and the output enable signal OEB, and outputs the result of the reverse OR operation to the third and fourth delay portions 86 and 88. Here, it can be recognized that the level of data output from the NAND gate 54 is always the same as that of data output from the NOR gate 56 while the data input portion 50 is enabled.

For example, when an output enable signal OEB of logic "high" level is received, data output via the output port OUT goes to a "high" impedance state 90 or 92 as shown in FIG. 4B. However, when an output enable signal OEB of logic "low" level is received, the output buffer of FIG. 3 normally operates and outputs data, which gradually varies from a logic "high" level to a logic "low" level or from a logic "low" level to a logic "high" level as shown in FIG. 4B, via the output terminal OUT.

The first, second, third and fourth delay portions 82, 84, 86 and 88 delay input data inverted in the data input portion 50 for first, second, third and fourth predetermined times, respectively, and output the delayed data one by one to the data output portion 80 over a time interval of $$\frac{T}{4}.$$

That is, the first delay portion 82 delays the result of inverse AND operation performed in the NAND gate 54 for a first predetermined time ($t_1$) using the inverters 62 and 64, and outputs delayed data D shown in FIG. 4E to the gate of the first pull-up transistor MP1. The second delay portion 84 delays the result of the inverse AND operation performed in the NAND gate 54 for a second predetermined time ($t_2$) using the inverters 66 and 68, and outputs delayed data B shown in FIG. 4F to the gate of the second pull-up transistor MP2. The third delay portion 86 delays the result of the inverse OR operation performed in the NOR gate 56 for a third predetermined time ($t_3$) using the inverters 70 and 72, and outputs delayed data C shown in FIG. 4D to the gate of the first pull-down transistor MN1. The fourth delay portion 88 delays the result of the inverse OR operation performed in the NOR gate 56 for a fourth predetermined time ($t_4$) using the inverters 74 and 76, and outputs the delayed data A shown in FIG. 4C to the gate of the second pull-down transistor MN2. Here, the aspect ratios of CMOS transistors included in the inverters 62, 64, 66, 68, 70, 72, 74 and 76 can be controlled so that when the input data DA is changed from a logic "high" level to a logic "low" level, an inequality of $t_1 < t_3 < t_2 < t_4$ is accomplished, and when the input data DA is changed from a logic "low" level to a logic "high" level, an inequality of $t_4 < t_2 < t_3 < t_1$ is accomplished.

For example, it is assumed that a logic "low" output enable signal OEB is received as shown in FIG. 4A. With regard to the delay times or output sequence of data output from the first through fourth delay portions 82, 84, 86 and 88, when the level of the input data DA changes from a logic "high" level to a logic "low" level, first, the level of the output D of the first delay portion 82 shown in FIG. 4E changes from a logic "low" level to a logic "high" level as shown by reference numeral 94. Then, the level of the output C of the third delay portion 86 shown in FIG. 4D changes from a logic "low" level to a logic "high" level as shown by reference numeral 96. Thereafter, the level of the output B of the second delay portion 84 shown in FIG. 4F changes from a logic "low" level to a logic "high" level as shown by reference numeral 98. Finally, the level of the output A of the fourth delay portion 88 shown in FIG. 4C changes from a logic "low" level to a logic "high" level as shown by reference numeral 100. That is, the first through fourth delay portions 82, 84, 86 and 88 output the delayed data one by one in the order of D, C, B and A to the data output portion 80 at time intervals of $$\frac{T}{4}(=t_d).$$

However, when the level of the input data DA changes from a logic "low" level to a logic "high" level, first, the level of the output A of the fourth delay portion 88 shown in FIG. 4C changes from a logic "high" level to a logic "low" level as shown by reference numeral 102. Then, the level of the output B of the second delay portion 84 shown in FIG. 4F changes from a logic "high" level to a logic "low" level as shown by reference numeral 104. Thereafter, the level of the output C of the third delay portion 86 shown in FIG. 4D changes from a logic "high" level to a logic "low" level as shown by reference numeral 106. Finally, the level of the output D of the first delay portion 82 shown in FIG. 4E changes from a logic "high" level to a logic "low" level as shown by reference numeral 108. That is, the first through fourth delay portions 82, 84, 86 and 88 output delayed data one by one in the order of A, B, C and D, to the data output portion 80 at time intervals of $$\frac{T}{4}(=t_d).$$

The first and second pull-up transistors MP1 and MP2 in the data output portion 80 shown in FIG. 3 are turned on in response to the outputs D and B of the first and second delay portions 82 and 84, respectively, and each has a source and a drain connected between the supply voltage $V_{DD}$ and the output terminal OUT. The first and second pull-down transistors MN1 and MN2 in the data output portion 80 shown in FIG. 3 are turned on in response to the outputs C and A of the third and fourth delay portions 86 and 88, respectively, and each has a source and a drain connected between the reference voltage $V_{SS}$ and the output terminal OUT.

The operation of the data output portion 80 in response to data that has been delayed by the first through fourth delay portions 82, 84, 86 and 88 and sequentially output, when the level of the output enable signal OEB changes to a logic "low" level, will now be described. For example, when the first pull-up transistor MP1 is on and the input data DA is at a logic "high" level, the first pull-up transistor MP1 is turned off if the level of the input data DA changes to a logic "low" level, so that the source current is lowered. Thus, the level of data output via the output terminal OUT is lowered by one step 91 as shown in FIG. 4B. When the first pull-down transistor MN1 is off and the input data DA is at a logic "high" level, the first pull-down transistor MN1 is turned on when the level of the input data DA changes to a logic "low" level, so that the sink current is increased. Thus, the level of data output via the output terminal OUT is further lowered by one step 93 as shown in FIG. 4B. When the second pull-up transistor MP2 is on and the input data DA is at a logic "high" level, the second pull-up transistor MP2 is turned off when the input data DA changes to a logic "low" level, so that the source current is further lowered. Thus, the level of data output via the output terminal OUT is further lowered by one step 95 as shown in FIG. 4B. When the second pull-down transistor MN2 is off and the input data DA is at a logic "high" level, the second pull-down transistor MN2 is turned on when the input data DA changes to a logic "low" level, so that the sink current is more increased. Thus, the level of data output via the output terminal OUT is further lowered by one step 97 as shown in FIG. 4B. As a consequence, as shown in FIG. 4B, the level of data output via the output terminal OUT is gradually lowered at a predetermined time interval of $t_d$ rather than being suddenly lowered, thus making $$\frac{di}{dt}$$

in Equation 1 small.

However, when the input data DA shown in FIG. 4A changes from a logic "low" level back to a logic "high" level, the second pull-down transistor MN2 is turned off, and the sink current is thus lowered. Thus, the level of the data output via the output terminal OUT is increased by one step 99 as shown in FIG. 4B. When the second pull-up transistor MP2 is off and the input data DA is at a logic "low" level, the second pull-up transistor MP2 is turned on when the input data DA changes to a logic "high" level, so that the source current is increased. Thus, the level of data output via the output terminal OUT is further increased by one step 101 as shown in FIG. 4B. When the first pull-down transistor MN1 is on and the input data DA is at a logic "low" level, the first pull-down transistor MN1 is turned off when the input data DA changes to a logic "high" level, so that the sink current is further lowered. Thus, the level of the data output via the output terminal OUT is further increased by one step 103 as shown in FIG. 4B. When the first pull-up transistor MP1 is off and the input data DA is at a logic "low" level, the first pull-up transistor MP1 is turned on when the input data DA changes to a logic "high" level, so that the source current is more increased. Thus, the level of the data output via the output terminal OUT is further increased by one step 105 as shown in FIG. 4B. As a consequence, as shown in FIG. 4B, the level of data output via the output terminal OUT is gradually increased at a predetermined time interval of $t_d$ rather than being suddenly increased, thus making $$\frac{di}{dt}$$

in Equation 1 small.

In the case where the width of the first pull-up transistor MP1 is 4.5–5.5 times greater than that of the second pull-up transistor MP2 shown in FIG. 3, the amount of source current is increased when the pull-up transistors MP1 and MP2 are turned on. In the case where the width of the second pull-down transistor MN2 is 4.5–5.5 times greater than that of the first pull-down transistor MN1 shown in FIG. 3, the amount of sink current is increased when the pull-down transistors MN1 and MN2 are turned on. As a consequence, the switching noise (or ground bounce effect) of the output buffer of FIG. 3 can be minimized or the output buffer can operate at high speed, by controlling the widths between the pull-up transistors and the widths between the pull-down transistors.

By controlling the aspect ratios of the CMOS transistors included in the inverters 62, 64, 66, 68, 70, 72, 74 and 76, when the input data DA changes from a logic "high" level to a logic "low" level, an inequality of $t_1<t_4<t_2<t_3$, $t_2<t_3<t_1<t_4$, or $t_2<t_4<t_1<t_3$ is accomplished, but when the input data DA changes from a logic "low" level to a logic "high" level, an inequality of $t_4<t_1<t_3<t_2$, $t_3<t_2<t_4<t_1$, or $t_3<t_1<t_4<t_2$ is accomplished. For example, when the input data DA changes from a logic "high" level to a logic "low" level, the first through (M+N)th delay portions 32 through 34 and 36 through 38 output delayed signals to the data output portion 40 so that the pull-down transistors are turned on after the pull-up transistors are turned off. Conversely, when the input data DA changes from a logic "low" level to a logic "high" level, the first through (M+N)th delay portions 32 through 34 and 36 through 38 output delayed signals to the data output portion 40 so that the pull-up transistors are turned on after the pull-down transistors are turned off.

Figure 5:
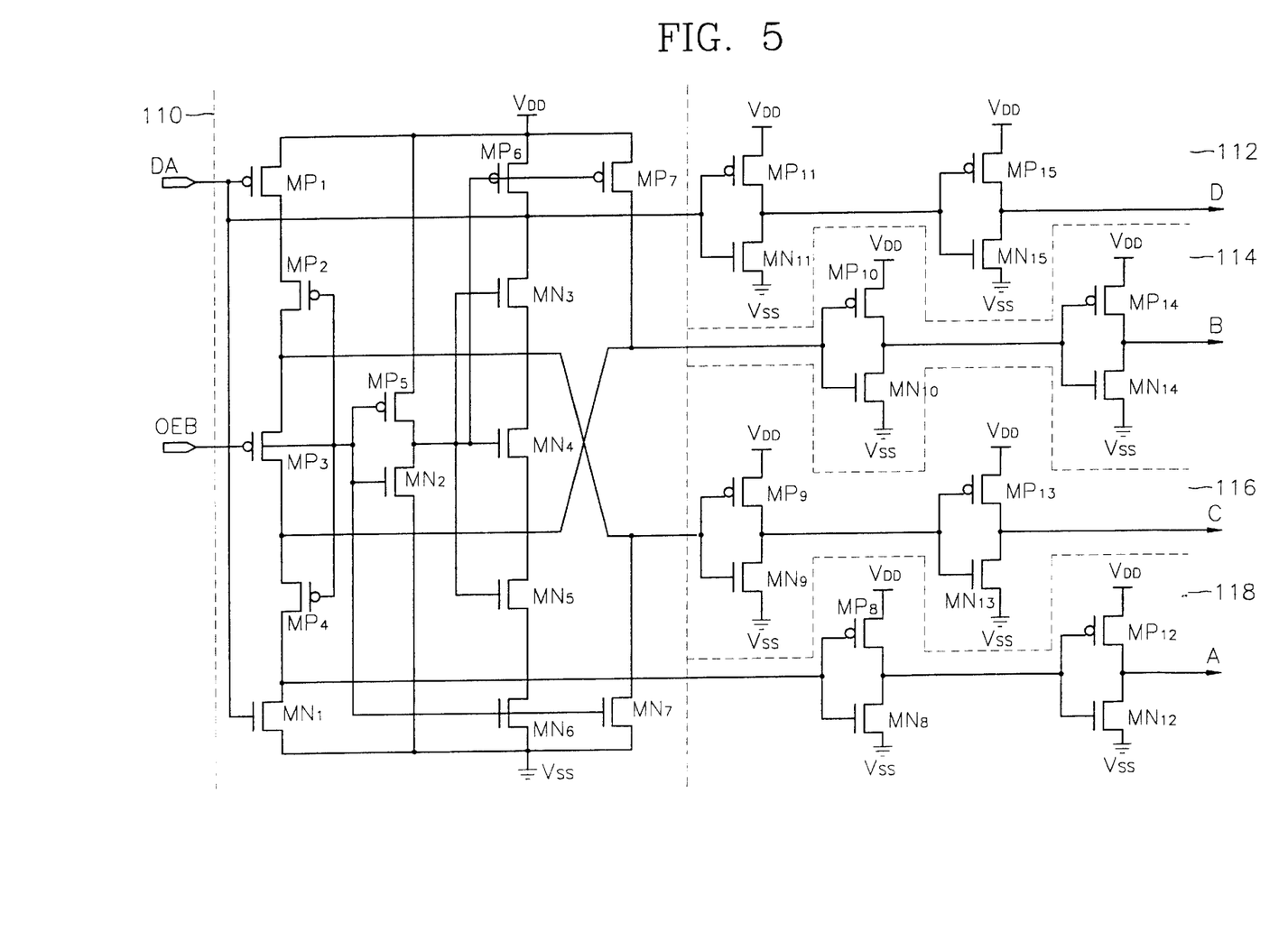
FIG. 5 is a circuit diagram illustrating the data input portion and the first through fourth delay portions shown in FIG. 3 in accordance with one embodiment of the present invention.

FIG. 5 is a circuit diagram illustrating an embodiment of the present invention of the data input portion 50 and the first through fourth delay portions 82, 84, 86 and 88 shown in FIG. 3. The data input portion 50 corresponds to a data input portion 110 and the first through fourth delay portions 82, 84, 86 and 88 correspond to the first through fourth delay portions 112, 114, 116 and 118, respectively.

The data input portion 110 of FIG. 5 includes PMOS transistors $MP_1$, $MP_2$, $MP_3$, $MP_4$, $MP_5$, $MP_6$ and $MP_7$ and NMOS transistors $MN_1$, $MN_2$, $MN_3$, $MN_4$, $MN_5$, $MN_6$ and $MN_7$, and minimizes the propagation delay time. Also, each of two inverters constituting of the first through fourth delay portions 112, 114, 116 and 118 is embodied by a CMOS transistor, and the CMOS transistor has an aspect ratio set so that each delay time becomes different according to whether the NMOS transistor is turned on or the PMOS transistor is turned on.

For example, when the desired propagation delay time is 2 ns, the aspect ratio is set so that the delayed data in the order of A, B, C and D or of D, C, B and A at time intervals of 0.5 ns is output from one of the first through fourth delay portions 82, 84, 86 and 88.

Figure 6:
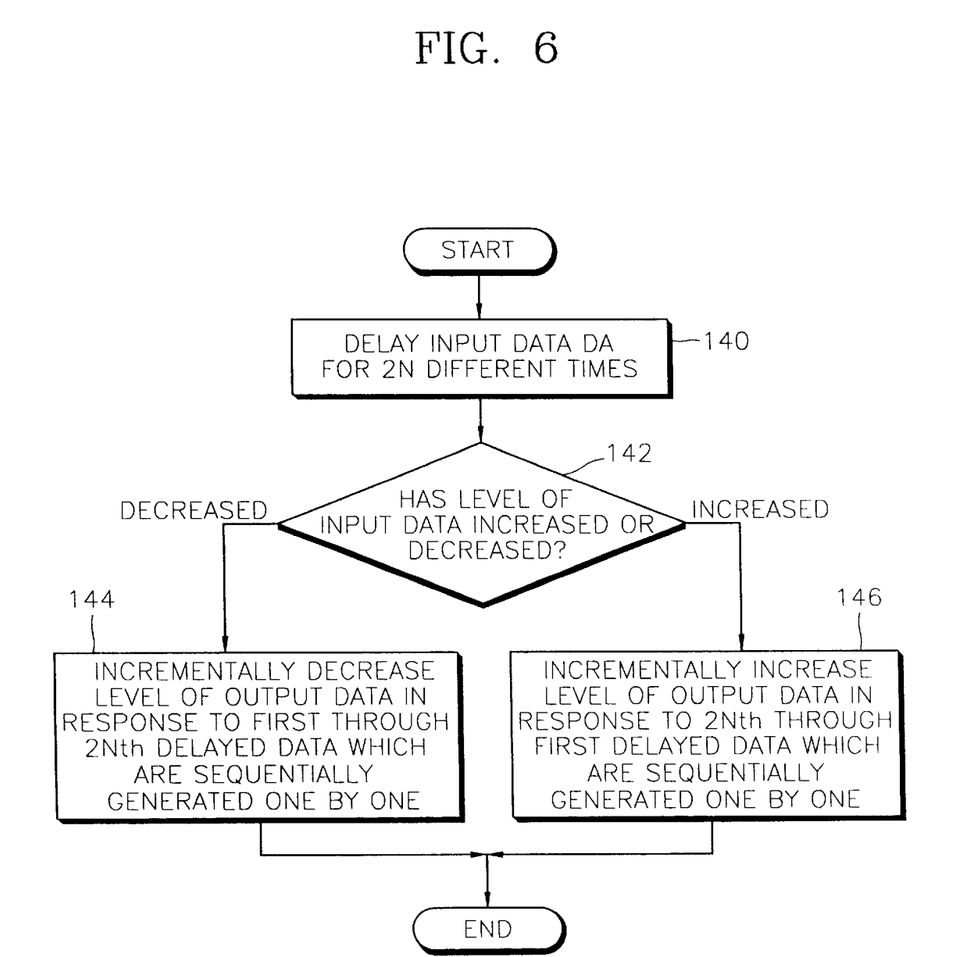
FIG. 6 is a flowchart for illustrating a buffering method according to one embodiment of the present invention which can be performed in the output buffer shown in FIG. 2.

A buffering method performed by an output buffer according to the present invention will now be described with reference to the attached drawings. FIG. 6 is a flowchart for illustrating a buffering method according to the present invention which can be performed in the output buffer shown in FIG. 2. This buffering method is comprised of step 140 of delaying input data DA for 2N different times, and steps 142, 144 and 146 of gradually changing the level of output data in the direction in which the level of input data DA changes.

Referring to FIG. 6, the first through (M+N)th delay portions 32 through 34 and 36 through 38 shown in FIG. 2 delay input data DA for (M+N=2N) different delay times, and generate first through (M+N)th delayed data at time intervals of $$\frac{T}{M+N},$$

in step 140. Next, in step 142, it is determined whether the input data DA has changed from a first logic level to a second logic level which is complementary to the first logic level, for example, whether the input data DA has changed from a logic "high" level to a logic "low" level. The NMOS or PMOS transistor of CMOS transistors for each of the two inverters included in each of the first through (M+N)th delay portions 32 through 34 and 36 through 38 is turned on or off according to the change in the level of the input data.

If the input data changes from a logic "high" level to a logic "low" level, the level of data output via the output terminal OUT is incrementally decreased from the logic "high" level to the logic "low" level in time units of $t_d$, as shown in FIG. 4B, in response to delayed data which are sequentially generated one by one, in step 144. However, if the input data DA changes from a logic "low" level to a logic "high" level, the level of data output via the output terminal OUT is incrementally increased from the logic "low" level to the logic "high" level in time units of $t_d$, as shown in FIG. 4B in response to delayed data which are sequentially generated one by one, in step 146.

In an output buffer and a buffering method performed therein according to the present invention as described above, pull-up and pull-down transistors operate in a predetermined order, and the aspect ratios and current driving capacities of the pull-up and pull-down transistors are differentiated, thereby preventing an abrupt change in the output current. Therefore, the ground bounce effect and noise and distortion of buffered data can be minimized due to a reduction of $$\frac{di}{dt}$$

in Equation 1, signal propagation characteristics can be improved when high speed operation is required, and propagation delay times of arbitrary lengths can be obtained.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An output buffer for buffering input data and outputting buffered input data as output data, the output buffer comprising:

first through M-th and (M+1)th through (M+N)th delay means for delaying the input data for (M+N) different delay times and outputting delayed data in a predetermined order at time intervals of $$\frac{T}{M+N},$$

where M and N are each integers equal to or greater than 2, and T corresponds to the time necessary for the level of the output data to change; and a data output means for outputting the output data in response to the outputs of the first through (M+N)th delay means.

2. The output buffer of claim 1, further comprising:

an inversion means for inverting the input data and outputting inverted input data to the first through (M+N)th delay means, wherein the first through (M+N)th delay means delay the inverted input data for M+N different times and sequentially output delayed data to the data output means at time intervals of $$\frac{T}{M+N}.$$

3. The output buffer of claim 2, wherein the data output means comprises:

first through M-th pull-up transistors; and
   first through N-th pull-down transistors, wherein each of the first through M-th pull-up transistors is turned on in response to a corresponding output among the outputs of the first through M-th delay means and corresponds to first MOS transistor having a source and drain connected between a supply voltage and the output data, and each of the first through N-th pull-down transistors is turned on in response to a corresponding output among the outputs of the (M+1)th through (M+N)th delay means and corresponds to second MOS transistor having a drain and source connected between the output data and a reference voltage.

4. The output buffer of claim 2 wherein the inversion means inverts the input data in response to an output enable signal and outputs the inverted input data to the first through (M+N)th delay means.

5. The output buffer of claim 3 wherein the inversion means inverts the input data in response to an output enable signal and outputs the inverted input data to the first through (M+N)th delay means.

6. The output buffer of claim 1, wherein each of the first through (M+N)th delay means comprises two inverters which are connected to each other in series, and each of the inverters includes a complementary MOS (CMOS) transistor, and the M+N different times are controlled by changing the aspect ratio of each of the CMOS transistors.

7. A buffering method performed in an output buffer for buffering input data and outputting buffered input data as output data, the method comprising the steps of:

(a) delaying the input data for (M+N) different predetermined times and generating first through (M+N)th delayed data in a predetermined order at time intervals of $$\frac{T}{M+N},$$

where M and N are each integers equal to or greater than 2, and T corresponds to the time necessary for the level of the output data to change;

(b) determining whether the input data has changed from a first logic level to a second logic level, wherein the second logic level is complementary to the first logic level;

(c) gradually changing the level of the output data from the first logic level to the second logic level at time intervals of $$\frac{T}{M+N}$$

in response to the first through (M+N)th delayed data which are generated in a predetermined order, if the level of the input data changes from the first logic level to the second logic level; and (d) gradually changing the level of the output data from the second logic level to the first logic level at time intervals of $$\frac{T}{M+N}$$

in response to the (M+N)th through first delayed data which are generated in a predetermined order, if the level of the input data changes from the second logic level to the first logic level.

8. The method of claim 7, wherein in step (c) of the buffering method performed in the output buffer having first through M-th pull-up transistors for sourcing current in response to the first through M-th delayed data, and first through N-th pull-down transistors for sinking current in response to the (M+1)th through (M+N)th delayed data, the first through (M+N)th delayed data are generated one by one in a predetermined order so that the Q ($1 \leq Q \leq N$) pull-down transistor is turned on after the P ($1 \leq P \leq M$) pull-up transistor is turned off.

9. The method of claim 8, wherein in step (d) of the buffering method, the (M+N)th through first delayed data are generated one by one in a predetermined order so that the P ($1 \leq P \leq M$) pull-up transistor is turned on after the Q ($1 \leq Q \leq N$) pull-down transistor is turned off.

10. An output buffer for buffering input data and outputting buffered input data as output data, the output buffer comprising:

a data input means enabled in response to an output enable signal, to invert the input data and output the inverted input data;

first through fourth delay means for delaying the inverted input data for first, second, third and fourth predetermined times and outputting delayed data in a predetermined order at time intervals of $$\frac{T}{4},$$

where T corresponds to the time necessary for the level of the output data to change;

first and second pull-up transistors which are separately turned on in response to the outputs of the first and second delay means, each of the first and second pull-up transistors having a source and drain connected between a supply voltage and the output data; and first and second pull-down transistors which are separately turned on in response to the outputs of the third and fourth delay means, each of the first and second pull-down transistors having a drain and source connected between the output data and a reference voltage.

11. The output buffer of claim 10, wherein the width of the first pull-up transistor is a predetermined number of times wider than the width of the second pull-up transistor.

12. The output buffer of claim 10, wherein the width of the second pull-down transistor is a predetermined number of times wider than the width of the first pull-down transistor.

* * * * *